US011139193B2

(12) United States Patent
Utano et al.

(10) Patent No.: US 11,139,193 B2
(45) Date of Patent: Oct. 5, 2021

(54) DEVICE AND METHOD FOR POSITIONING FIRST OBJECT IN RELATION TO SECOND OBJECT

(71) Applicant: SHINKAWA LTD., Tokyo (JP)

(72) Inventors: Tetsuya Utano, Tokyo (JP); Yuichiro Noguchi, Tokyo (JP); Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 82 days.

(21) Appl. No.: 16/632,870

(22) PCT Filed: Jul. 12, 2018

(86) PCT No.: PCT/JP2018/026292
§ 371 (c)(1),
(2) Date: Mar. 11, 2020

(87) PCT Pub. No.: WO2019/013274
PCT Pub. Date: Jan. 17, 2019

(65) Prior Publication Data
US 2020/0251369 A1   Aug. 6, 2020

(30) Foreign Application Priority Data
Jul. 12, 2017   (JP) .............................. JP2017-136065

(51) Int. Cl.
*H01L 21/68* (2006.01)
*B65G 47/91* (2006.01)
(Continued)

(52) U.S. Cl.
CPC ............ *H01L 21/681* (2013.01); *B65G 47/91* (2013.01); *H01L 21/67144* (2013.01);
(Continued)

(58) Field of Classification Search
CPC ......... H01L 21/67132; H01L 21/67144; H01L 21/67259; H01L 2224/75753; H01L 2224/759; H01L 2224/78753
See application file for complete search history.

(56) References Cited

U.S. PATENT DOCUMENTS

| 6,464,126 B2 | 10/2002 | Hayata et al. |
| 2017/0148759 A1 | 5/2017 | Hayata et al. |

FOREIGN PATENT DOCUMENTS

| JP | 2001203234 | 7/2001 |
| WO | 2015170645 | 11/2015 |
| WO | 2018062129 | 4/2018 |

OTHER PUBLICATIONS

"International Search Report (Form PCT/ISA/210)" of PCT/JP2018/026292, dated Oct. 9, 2018, with English translation thereof, pp. 1-2.

(Continued)

*Primary Examiner* — David A Zarneke
(74) *Attorney, Agent, or Firm* — JCIPRNET

(57) ABSTRACT

This mounting device (100) comprises: a base (10) that moves linearly in relation to a substrate (16); a bonding head (20) that is attached to the base (10); a camera (25) that is attached to the base (10) and identifies the position of the substrate (16); a linear scale (33) having a plurality of graduations along the movement direction; a bonding head-side encoder head (31); and a camera-side encoder head (32). A control unit (50) causes the base (10) to move to a position where the bonding head-side encoder head (31) detects the position of a graduation. Due to this configuration, positioning accuracy of a semiconductor die (15) in relation to the substrate (16) is improved.

9 Claims, 10 Drawing Sheets

(51) Int. Cl.
 H01L 21/67 (2006.01)
 H01L 21/66 (2006.01)
 H01L 23/00 (2006.01)
 H01L 21/52 (2006.01)

(52) U.S. Cl.
 CPC .. *H01L 21/67242* (2013.01); *H01L 21/67259* (2013.01); *H01L 22/12* (2013.01); *H01L 24/75* (2013.01); *H01L 24/78* (2013.01); *H01L 24/81* (2013.01); *H01L 24/83* (2013.01); *H01L 24/85* (2013.01); *H01L 21/52* (2013.01); *H01L 2224/75702* (2013.01); *H01L 2224/75744* (2013.01); *H01L 2224/75753* (2013.01); *H01L 2224/78702* (2013.01); *H01L 2224/78744* (2013.01); *H01L 2224/78753* (2013.01); *H01L 2224/78824* (2013.01); *H01L 2224/81123* (2013.01); *H01L 2224/81129* (2013.01); *H01L 2224/83123* (2013.01); *H01L 2224/83129* (2013.01); *H01L 2224/85123* (2013.01); *H01L 2224/85129* (2013.01)

(56) References Cited

OTHER PUBLICATIONS

"Written Opinion of the International Searching Authority (Form PCT/ISA/237)" of PCT/JP2018/026292, dated Oct. 9, 2018, with English translation thereof, pp. 1-9.

DEVICE AND METHOD FOR POSITIONING FIRST OBJECT IN RELATION TO SECOND OBJECT

CROSS-REFERENCE TO RELATED APPLICATION

This application is a 371 application of the International PCT application serial no. PCT/JP2018/026292, filed on Jul. 12, 2018, which claims the priority benefits of Japan Patent Application No. 2017-136065, filed on Jul. 12, 2017. The entirety of each of the above-mentioned patent applications is hereby incorporated by reference herein and made a part of this specification.

TECHNICAL FIELD

The present invention relates to a device and a method for positioning a first object in relation to a second object.

BACKGROUND ART

For example, for manufacturing semiconductor devices, many bonding apparatus such as a mounting device for mounting an electronic component such as a semiconductor die on a substrate or another semiconductor die, and a wire bonding apparatus for bonding wires to electrodes of a semiconductor die and electrodes of a substrate are used. A bonding apparatus includes a bonding head mounted on an XY table, a bonding arm attached to the bonding head to move a bonding tool in a vertical direction, and a position detection camera attached to the bonding head to detect a bonding position of a substrate. A center line of the bonding tool and an optical axis of the position detection camera are disposed a predetermined offset distance from each other. In addition, in many cases, after the optical axis of the position detection camera is aligned with the bonding position, the bonding head is moved the offset distance to move the center line of the bonding tool to the bonding position, thereby performing a bonding operation.

On the other hand, when the bonding operation is continued, the offset distance changes due to a temperature rise. For this reason, even when the bonding head is moved the offset distance after the optical axis of the position detection camera is aligned with the bonding position, the center line of the bonding tool may not be at the bonding position. Therefore, a bonding apparatus has been proposed in which positioning accuracy is improved by calibrating an offset distance during a bonding operation (for example, see Patent Literature 1).

CITATION LIST

Patent Literature

[Patent Literature 1]
 Japanese Patent Laid-Open No. 2001-203234

SUMMARY OF INVENTION

Technical Problem

However, in the conventional bonding apparatus described in Patent Literature 1, it is necessary to move the bonding head to a position of a reference member in order to calibrate an offset amount. In this bonding apparatus, when the bonding head moves, a temperature of the bonding head or the like changes and the offset distance also changes, and thus there is a problem that positioning accuracy is not sufficient.

Therefore, the present invention which has an objective to improve positioning accuracy of a first object in relation to a second object is provided.

Solution to Problem

A device of the present invention is a device for positioning a first object in relation to a second object, which is characterized by including: a moving body which moves linearly in relation to the second object; a holding unit attached to the moving body to hold the first object; a position identifying means which is attached to the moving body with a predetermined interval from the holding unit in a moving direction of the moving body and identifies a position of the second object; a scale which is disposed in the moving direction of the moving body and has a plurality of graduations in the moving direction; a first position detection unit which is attached to the moving body to correspond to the holding unit and detects a position of the holding unit on the basis of the graduations; a second position detection unit which is attached to the moving body with a predetermined interval from the first position detection unit to correspond to the position identifying means and detects a position of the graduation on the scale that corresponds to the identified position of the second object; and a control unit which moves the moving body to a position at which the first position detection unit detects the position of the graduation to position the first object in relation to the second object.

In the device of the present invention, the first object may be a semiconductor die, the second object may be a substrate or other semiconductor die on which the semiconductor die is mounted, and the device may position the first object at a predetermined region of the second object.

In the device of the present invention, the position identifying means may be a camera that optically identifies the position of the second object, and the control unit may move the moving body to a first position at which a specific region of the second object is within a field of view of the position identifying means, detect the position of the graduation on the scale at the first position using the second position detection unit, detect a first relative position of the position identifying means in relation to the specific region on the basis of an image of the specific region of the second object captured by the position identifying means, and calculate a correction amount for correcting a position of the moving body when positioning the first object in relation to the second object, on the basis of the first relative position.

The device of the present invention may further include a holding position identifying means which is disposed on a holding surface side of the holding unit and identifies a second relative position of the first object in relation to the holding surface, and the control unit may calculate the correction amount for correcting the position of the moving body when positioning the first object in relation to the second object, on the basis of the second relative position.

In the device of the present invention, the control unit may calculate a position of a target graduation on the scale on the basis of the correction amount.

A method for positioning a first object in relation to a second object according to the present invention includes steps of: holding the first object using a holding unit; moving a moving body provided with the holding unit for holding the first object and a position identifying means to a predetermined position; identifying a position of the second object using the position identifying means attached to the moving body with a predetermined interval from the holding unit in a moving direction of the moving body; detecting a position of a graduation on a scale that corresponds to the identified position of the second object using a second position detection unit attached to the moving body with a predetermined interval from the a first position detection unit to correspond to the position identifying means; and positioning the first object in relation to the second object by reading a graduation on the scale using the first position detection unit disposed on the moving body and moving the holding unit to a position for detecting the position of the graduation.

Advantageous Effects of Invention

The present invention can improve positioning accuracy of a first object in relation to a second object.

DESCRIPTION OF EMBODIMENTS

<Configuration of Mounting Device>

Figure 1:
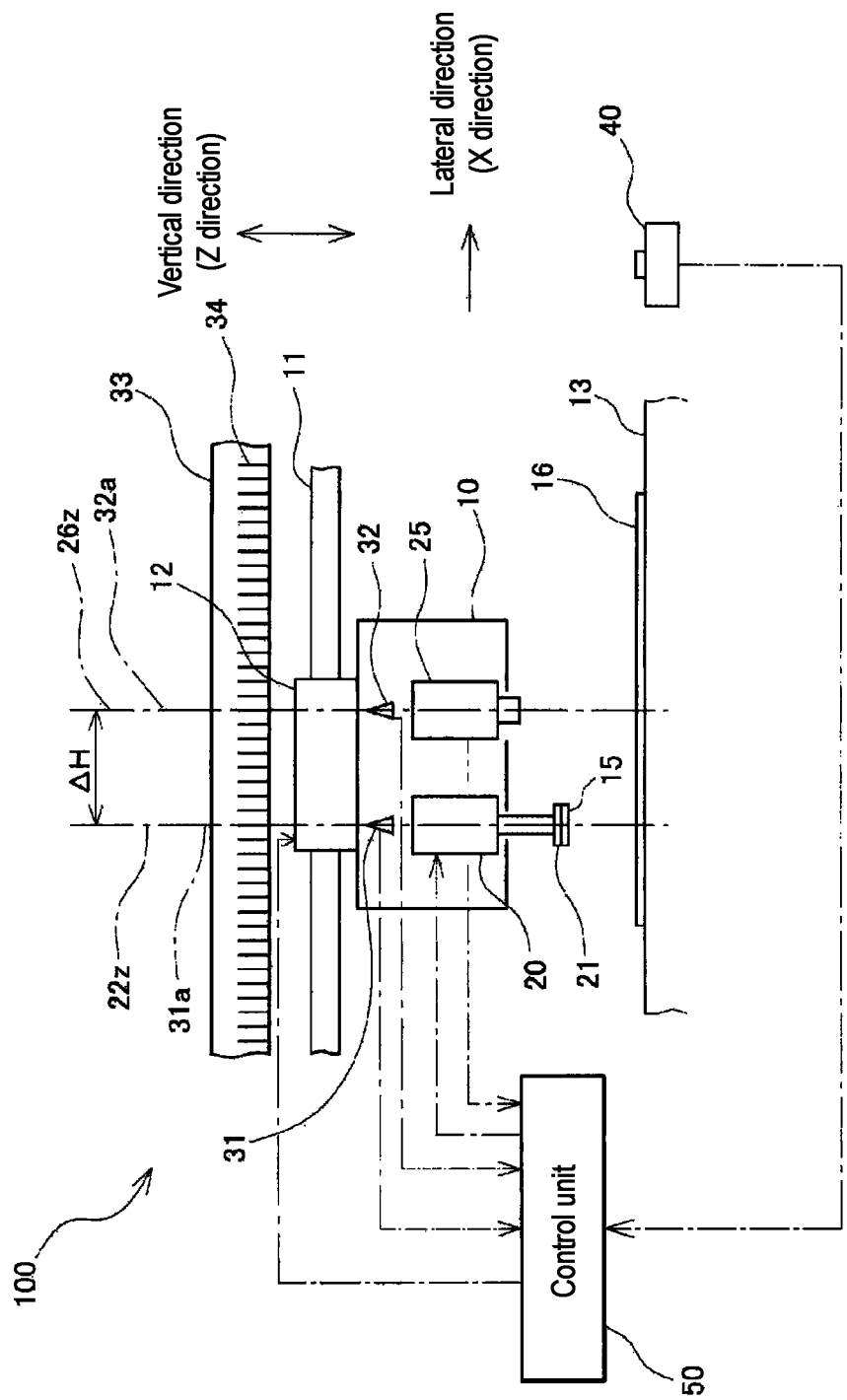
FIG. 1 is a system diagram showing a system configuration of a mounting device according to an embodiment.

Hereinafter, as a device for positioning a first object in relation to a second object, a mounting device 100 for mounting a semiconductor die 15 on a substrate 16 or the like will be described as an example. As shown in FIG. 1, the mounting device 100 of the present embodiment is a device that positions and mounts a semiconductor die 15 serving as the first object in a predetermined region of the substrate 16 serving as the second object or another semiconductor die (not shown) serving as the second object. The mounting device 100 includes a base 10 serving as a moving body, a bonding head 20 serving as a holding unit for holding the semiconductor die 15, a camera 25 serving as a position identifying means that identifies a position of the substrate 16, a bonding head-side encoder head 31 serving as a first position detection unit, a camera-side encoder head 32 serving as a second position detection unit, a linear scale 33 having a plurality of graduations 34, a control unit 50, a lower camera 40, and a bonding stage 13 which sucks and fixes the substrate 16. Here, the mounting device 100 may be, for example, a flip chip bonding apparatus that mounts the semiconductor die 15 on the substrate 16 after inverting the semiconductor die 15, and may be a die bonding apparatus that mounts the semiconductor die 15 on the substrate 16 without inverting the semiconductor die 15.

The base 10 is linearly moved in an X direction which is a lateral direction while being guided by a guide rail 11 extending in the X direction. Also, a linear motor 12 for driving the base 10 in the X direction is attached to the base 10.

The bonding head 20 and the camera 25 are attached to the base 10. The bonding head 20 moves a bonding tool 21, which is a mounting tool for vacuum-sucking the semiconductor die 15 and bonding the semiconductor die 15 to the substrate 16, in a Z direction which is a vertical direction. Reference numeral $22z$ in FIG. 1 indicates a Z directional center line of the bonding head 20. Further, since the bonding tool 21 is disposed coaxially with the Z directional center line $22z$ of the bonding head 20, the center line $22z$ is also a line passing through a center of the bonding tool 21. The camera 25 captures and obtains an image of the substrate 16 from above and optically identifies the position of the substrate 16. Reference numeral $26z$ in FIG. 1 indicates an optical axis of the camera 25. The bonding head 20 and the camera 25 are attached to the base 10 such that the Z directional center line $22z$ of the bonding head 20 and the optical axis $26z$ of the camera 25 are a predetermined interval $\Delta H$ from each other in the X direction which is the moving direction of the base 10. Here, the predetermined interval $\Delta H$ is an offset distance.

The bonding head-side encoder head 31 and the camera-side encoder head 32 are attached to the base 10. As shown in FIG. 1, the bonding head-side encoder head 31 is attached to the base 10 such that a center line $31a$ thereof is at the same position as the Z directional center line $22z$ of the bonding head 20. Also, the camera-side encoder head 32 is attached to the base 10 such that a center line $32a$ thereof is at the same position as a position C of the optical axis $26z$ of the camera 25. Therefore, the bonding head-side encoder head 31 and the camera-side encoder head 32 are attached to the base 10 with the predetermined interval ΔH therebetween in the X direction which is the moving direction of the base 10.

The common linear scale 33 extending in the X direction, which is the moving direction of the base 10, is disposed at a position facing the bonding head-side encoder head 31 and the camera-side encoder head 32. Graduations 34 are engraved on the linear scale 33 at predetermined intervals. The bonding head-side encoder head 31 and the camera-side encoder head 32 optically read the graduations 34 to detect a position on the linear scale 33. Further, the bonding head-side encoder head 31 detects a position of the bonding head 20 on the basis of the optically read graduations 34, and the camera-side encoder head 32 optically detects the graduations 34 corresponding to the identified position of the substrate 16.

The bonding stage 13 vacuum-sucks the substrate 16.

As shown in FIG. 1, the lower camera 40 is disposed at a position slightly away from the bonding stage 13, and images the bonding tool 21 and the semiconductor die 15 attached to a lower surface of the bonding tool 21 from below. The lower camera 40 is a holding position identifying means that identifies a relative position of the semiconductor die 15 in relation to the lower surface of the bonding tool 21.

As shown in FIG. 1, the linear motor 12 and the bonding head 20 are connected to the control unit 50 and are operated in accordance with commands from the control unit 50. Further, the bonding head-side encoder head 31 and the camera-side encoder head 32 are connected to the control unit 50, and data of the detected position of the graduation on the linear scale 33 is input to the control unit 50. Also, the camera 25 and the lower camera 40 are also connected to the control unit 50, and images captured by the camera 25 and the lower camera 40 are input to the control unit 50.

The control unit 50 is a computer in which a central processing unit (CPU) that performs information processing and a memory that stores operation programs and data are included, and the control unit 50 adjusts a position of the base 10 in the X direction.

The guide rail 11 and the linear scale 33 of the mounting device 100 shown in FIG. 1 can be integrally moved in a Y direction using a Y direction drive mechanism (not shown). The Y direction drive mechanism is connected to the control unit 50 and is operated in accordance with commands from the control unit 50. Also, the Y direction is a horizontal direction orthogonal to the X direction.

Further, although the configuration in which the bonding head-side encoder head 31 is attached to the base 10 such that the center line 31a thereof is at the same position as the Z directional center line 22z of the bonding head 20, and the camera-side encoder head 32 is attached to the base 10 such that the center line 32a thereof is at the same position as the optical axis 26z of the camera 25 has been described in the mounting device 100 of the present embodiment, the present invention is not limited thereto. As long as the bonding head-side encoder head 31 and the camera-side encoder head 32 are disposed apart from each other with the predetermined interval ΔH therebetween in the X direction, the bonding head-side encoder head 31 may be disposed near the bonding head 20, and the camera-side encoder head 32 may be disposed near the camera 25.

<Basic Operation of Mounting Device>

Figure 2:
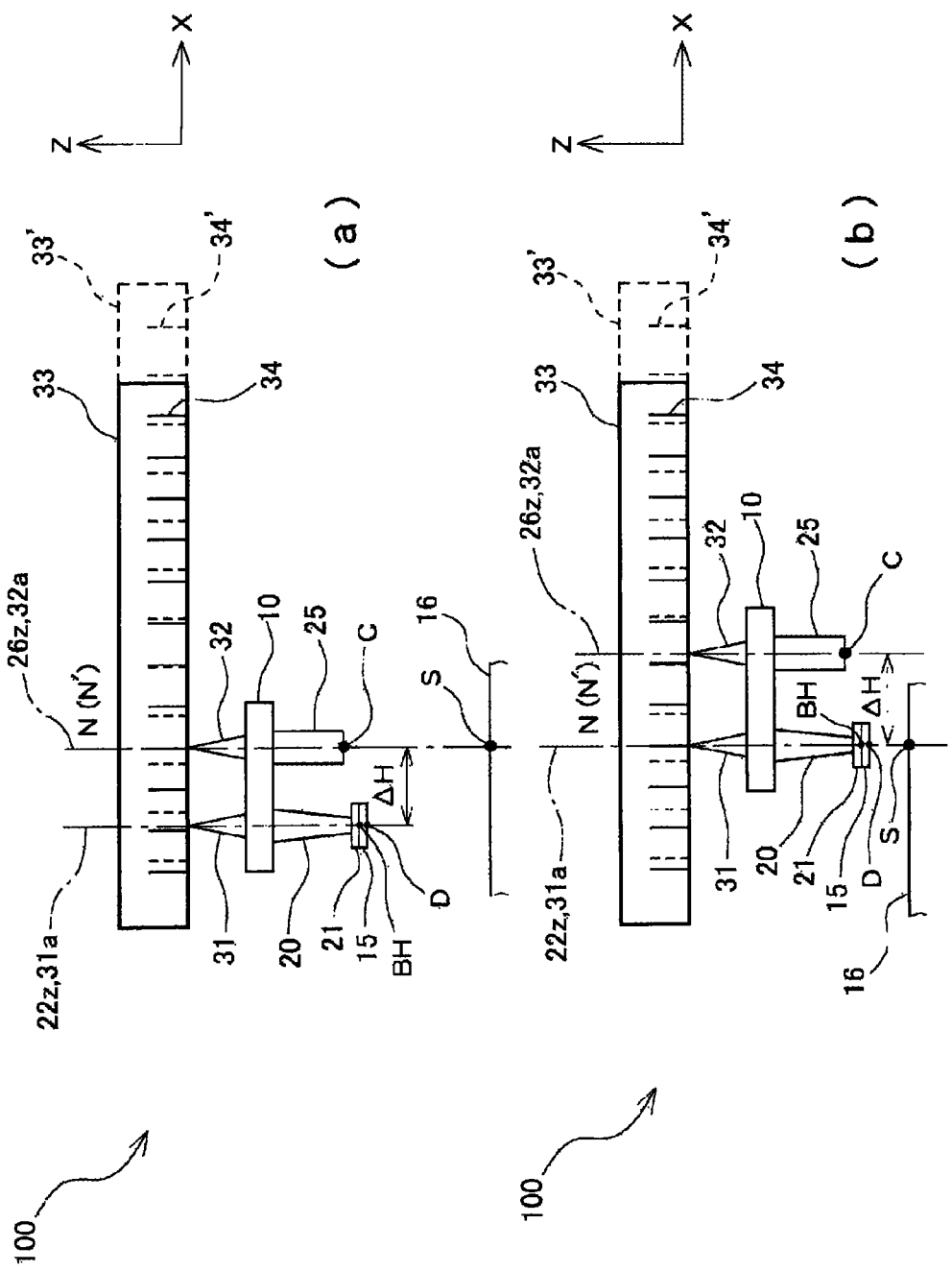
FIG. 2 is an explanatory diagram showing a basic operation when a linear scale thermally expands in the mounting device shown in FIG. 1, in which (a) of FIG. 2 shows a state at a first position and (b) of FIG. 2 shows a state in which a base is moved such that a center line of a bonding head-side encoder head is aligned with a position of a graduation on the linear scale detected by a camera-side encoder head.
Figure 3:
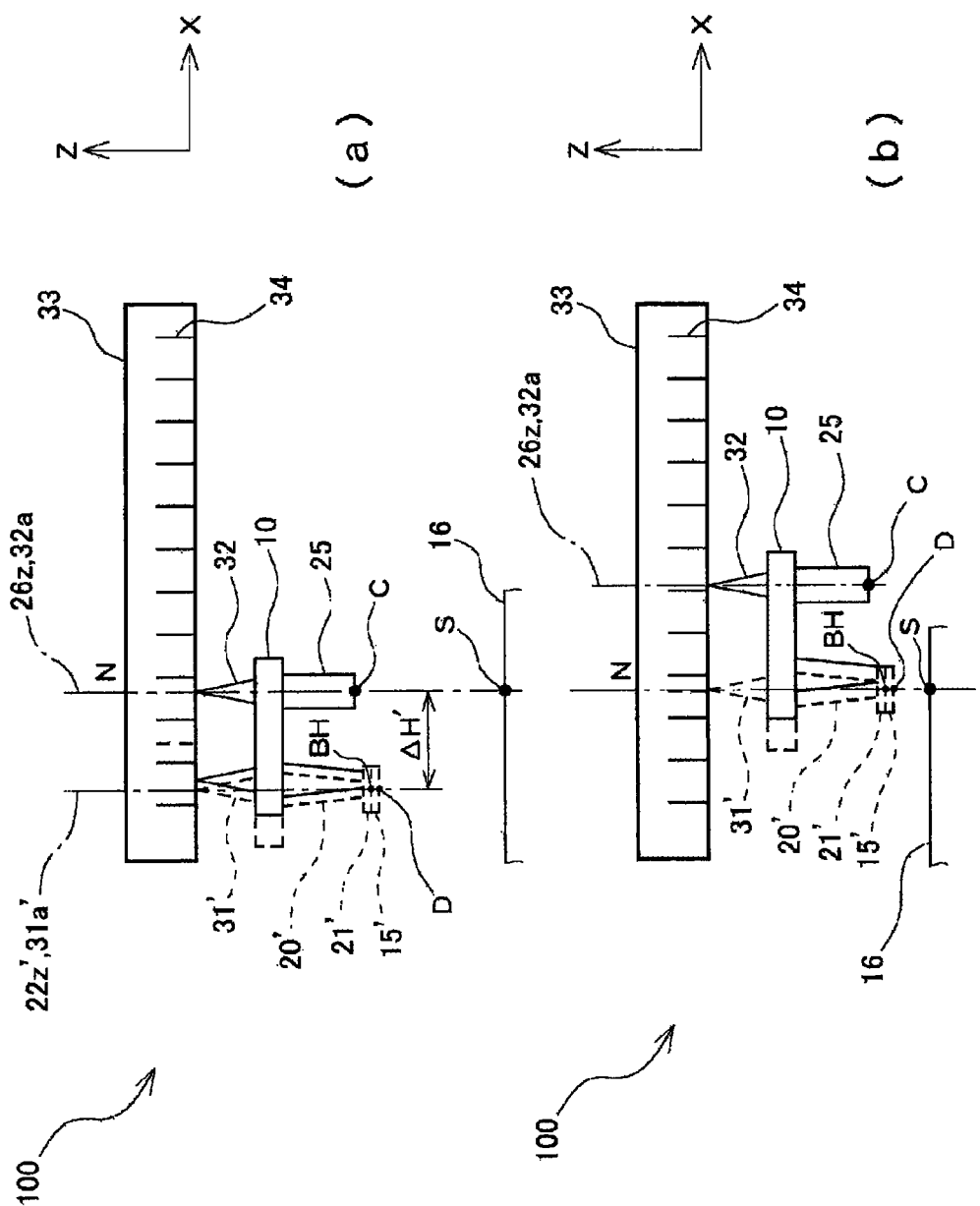
FIG. 3 is an explanatory diagram showing a basic operation when the base thermally expands in the mounting device shown in FIG. 1, in which (a) of FIG. 3 shows a state at the first position and (b) of FIG. 3 shows a state in which the base is moved such that the center line of the bonding head-side encoder head is aligned with the position of the graduation on the linear scale detected by the camera-side encoder head.

Next, a basic operation of the mounting device 100 according to the present embodiment will be described with reference to FIGS. 2 and 3. (a) of FIG. 2 shows a case in which the base 10 is at a first position. FIGS. 2 and 3 illustrate that the first position is a position at which the position C of the optical axis 26z of the camera 25 coincides with a center position S of a bonding region which is a specific region of the substrate 16, a center position BH of the bonding tool 21 and a center position D of the semiconductor die 15 coincide with each other, and the center position D of the semiconductor die 15 sucked by the bonding tool 21 is on the Z directional center line 22z of the bonding head 20.

As shown in (a) of FIG. 2, at the first position, the position C(x, y) of the optical axis 26z of the camera 25 coincides with the center position S(x, y) of the bonding region. At the first position, the center line 32a of the camera-side encoder head 32 is at a position of an N-th graduation on the linear scale 33. Data indicating that the center line 32a of the camera-side encoder head 32 is at the position of the N-th graduation on the linear scale 33 is input to the control unit 50 from the camera-side encoder head 32. Next, the control unit 50 moves the base 10 in the X direction using the linear motor 12 shown in FIG. 1. At this time, the control unit 50 detects data of a graduation on the linear scale 33 using the bonding head-side encoder head 31. Then, the control unit 50 moves the base 10 in the X direction until the graduation on the linear scale 33 detected by the bonding head-side encoder head 31 reaches the position of the N-th graduation. As shown in (b) of FIG. 2, when the graduation on the linear scale 33 detected by the bonding head-side encoder head 31 reaches the position of the N-th graduation, the graduation on the linear scale 33 for the center line 22z of the bonding head 20 and the center position D of the semiconductor die 15 are located at the position of the N-th graduation, that is, the center position S of the bonding region. In this manner, the mounting device 100 of the present embodiment can make the center position D of the semiconductor die 15 coincide with the center position S of the bonding region.

In (a) of FIG. 2 and (b) of FIG. 2, a linear scale 33' and graduations 34' indicated by broken lines show a state in which the linear scale 33 and graduations 34 are thermally expanded. When the linear scale 33 is thermally expanded, the position of the graduation detected by the camera-side encoder head 32 at the first position is N'. Then, the control unit 50 moves the base 10 in the X direction until the graduation on the linear scale 33 detected by the bonding head-side encoder head 31 reaches the position of the N'-th graduation. Thus, the graduation on the linear scale 33 for the center position D of the semiconductor die 15 can be adjusted to the position of the N'-th graduation, that is, the center position S of the bonding region.

As described above, even when the linear scale 33 is thermally expanded, the mounting device 100 of the present embodiment can adjust the center position D of the semiconductor die 15 to the center position S of the bonding region without calibrating the predetermined interval ΔH which is the offset distance.

(a) of FIG. 3 and (b) of FIG. 3 show a case in which the base 10 is thermally expanded in the X direction. In (a) of FIG. 3 and (b) of FIG. 3, a semiconductor die 15', a bonding head 20', a bonding tool 21', a center line 22z', a bonding head-side encoder head 31', and a center line 31a' indicated by broken lines show a state in which the semiconductor die 15, the bonding head 20, the bonding tool 21, the center line 22z, the bonding head-side encoder head 31, and the center line 31a are thermally expanded. As shown in (a) of FIG. 3, at the first position, the position C(x, y) of the optical axis 26z of the camera 25 coincides with the center position S(x, y) of the bonding region. At the first position, the center line 32a of the camera-side encoder head 32 is at the position of the N-th graduation on the linear scale 33. At this time, the center line 22z' of the bonding head 20' is located at a position away from the optical axis 26z of the camera 25 by a predetermined interval ΔH' in the X direction.

As described with reference to (b) of FIG. 2, the control unit 50 moves the base 10 in the X direction until the graduation on the linear scale 33 detected by the bonding head-side encoder head 31' reaches the position of the N-th graduation. Then, the graduation on the linear scale 33 for the center position D of the semiconductor die 15' is located at the position of the N-th graduation, that is, the center position S of the bonding region. In this manner, even when the base 10 is thermally expanded, the mounting device 100 of the present embodiment can adjust the center position D of the semiconductor die 15' to the center position S of the bonding region without calibrating the predetermined interval ΔH' which is the offset distance.

<Actual Operation of Mounting Device>

The configuration in which, in FIGS. 2 and 3, the first position is the position where the position C(x, y) of the optical axis 26z of the camera 25 coincides with the center position S(x, y) of the bonding region, the center position BH of the bonding tool 21 and the center position D of the semiconductor die 15 coincide with each other, and the center position D of the semiconductor die 15 sucked by the bonding tool 21 is on the center line 22z of the bonding head 20 has been described. However, actually, at the first position, there is a deviation between the position C of the optical axis 26z of the camera 25 and the center position S of the bonding region, and there is also a deviation between the center position D of the semiconductor die 15 sucked by the bonding tool 21 and the center position BH of the bonding tool 21. Accordingly, an actual operation (a method for mounting an electronic component) of the mounting device 100 will be described next with reference to FIGS. 4 to 6.

Figure 4:
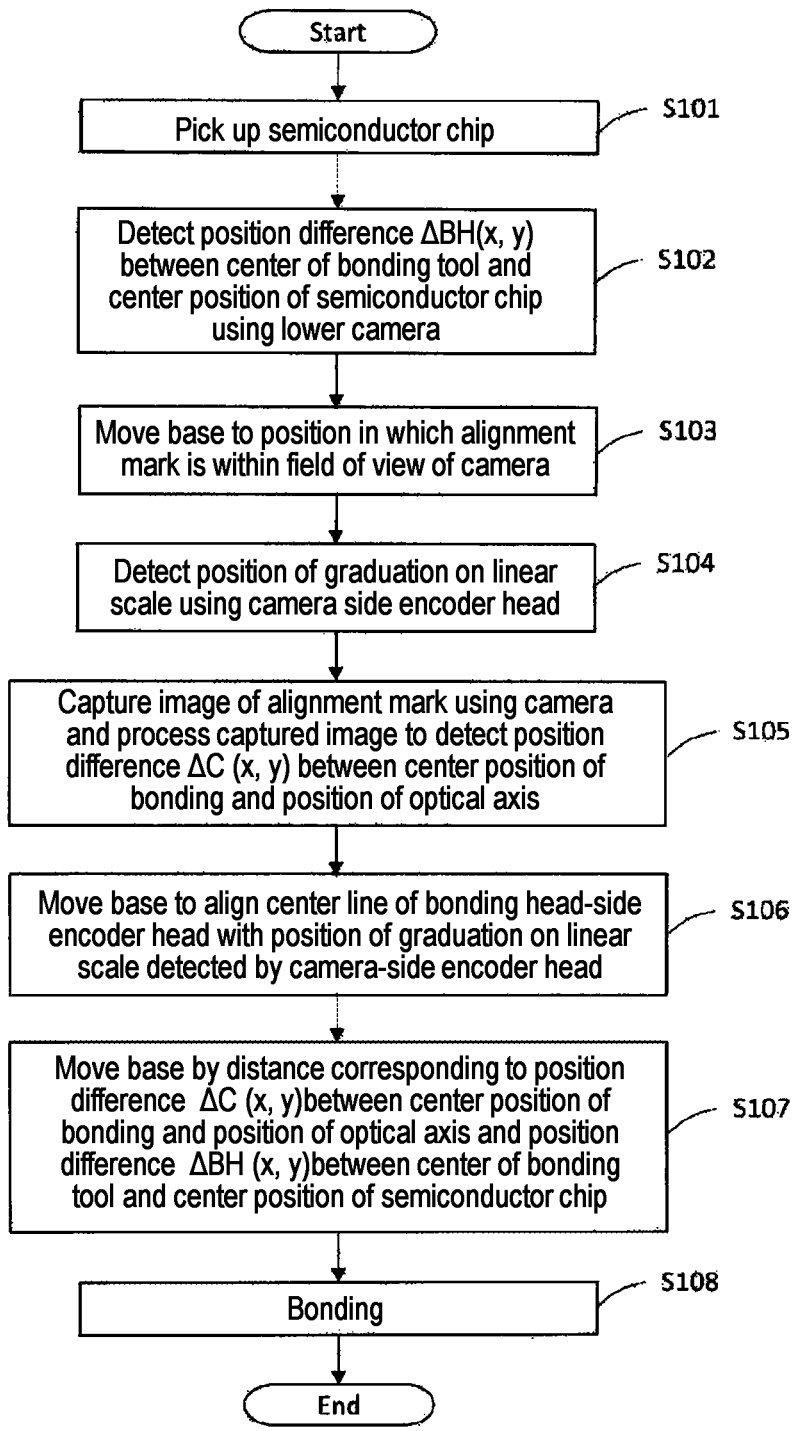
FIG. 4 is a flowchart showing an operation of the mounting device shown in FIG. 1.

As shown in step S101 in FIG. 4, the control unit 50 moves the bonding head 20 upward to a wafer holder or an intermediate stage (not shown), causes the bonding tool 21 to suck the semiconductor die 15 to pick up the semiconductor die 15, and holds the semiconductor die 15 using the bonding tool 21 (a holding step).

Next, as shown in step S102 of FIG. 4, the control unit 50 moves the bonding head 20 above the lower camera 40, and acquires images of the bonding tool 21 and the semiconductor die 15 using the lower camera 40. At this time, the images of the bonding tool 21 and the semiconductor die 15 are captured in a field of view 41 of the lower camera 40, as indicated by solid lines in (b) of FIG. 5. As shown in (b) of FIG. 5, in the field of view 41, the center position BH(x, y) of the bonding tool 21 and the center position D(x, y) of the semiconductor die 15 are deviated from each other by a position difference ΔBH(x, y). Further, in (b) of FIG. 5, reference numerals 22x and 22y indicate an X directional center line and a Y directional center line of the bonding head 20. Therefore, an intersection of the center line 22x and the center line 22y is the center position BH(x, y) of the bonding tool 21. Also, the lower camera 40 images the bonding tool 21 from below, and thus, a positive direction of the X axis in the field of view 41 thereof is opposite to that of the X axis in a field of view 27 of the camera 25 shown in (c) of FIG. 5, which images the substrate 16 from above.

Figure 5:
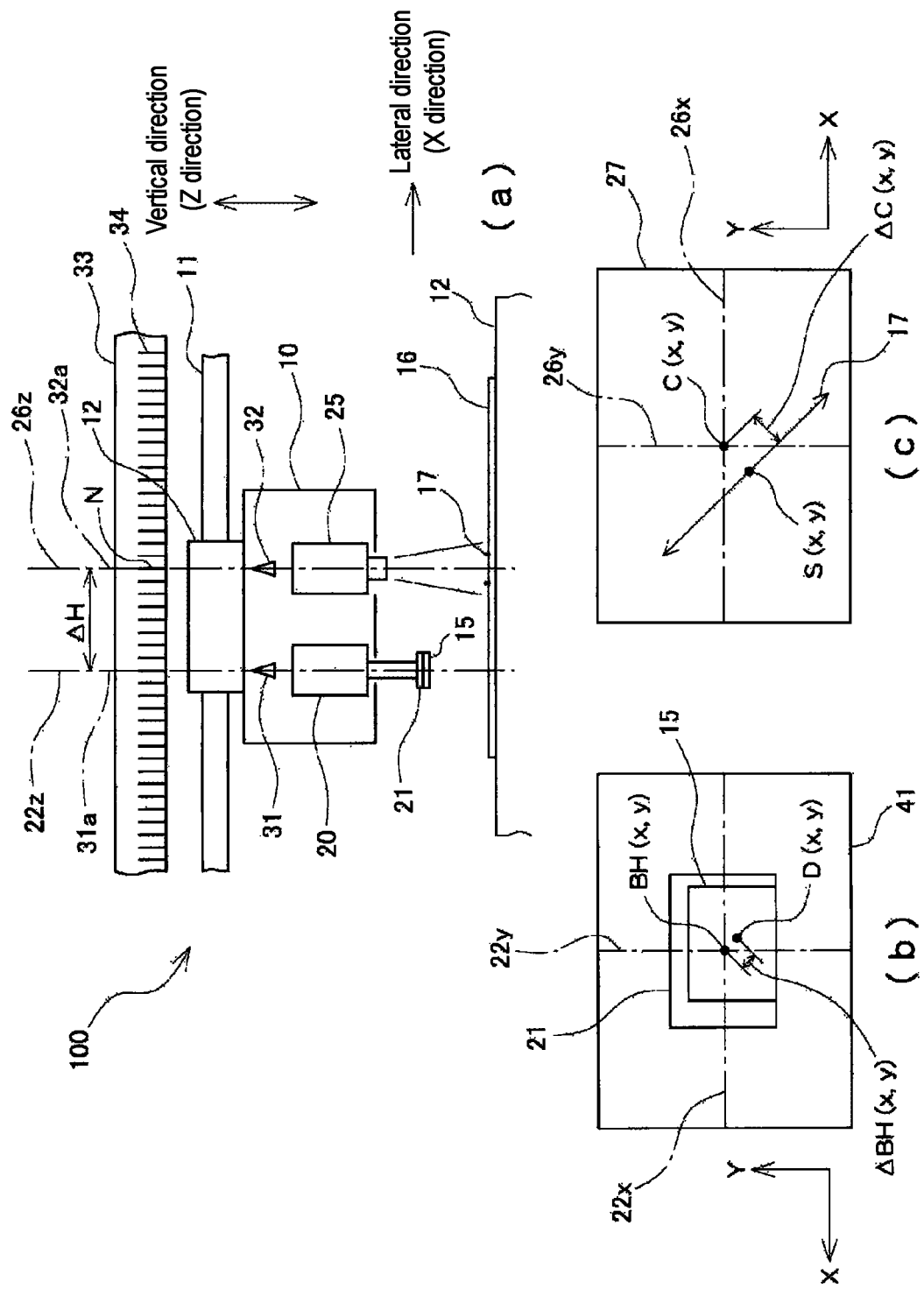
FIG. 5 shows an operation of the mounting device shown in FIG. 4, in which (a) of FIG. 5 is an elevational view with the base in the first position, (b) of FIG. 5 is an explanatory diagram showing a center position of a bonding tool and a relative position of a semiconductor die sucked by the bonding tool, and (c) of FIG. 5 is an explanatory diagram showing a field of view of a camera at the first position.

The control unit 50 processes the image shown in (b) of FIG. 5, and detects the position difference ΔBH(x, y), which is a second position difference, between the center position BH(x, y) of the bonding tool 21 and the center position D(x, y) of the semiconductor die 15. The position difference ΔBH is a second relative position of the semiconductor die 15 in relation to the lower surface of the bonding tool 21 which is a holding surface.

Next, as shown in step S103 of FIG. 4, the control unit 50 moves the base 10 to the first position in which an alignment mark 17 of the substrate 16 enters the field of view 27 of the camera 25 shown in (c) of FIG. 5 (a moving step). Then, as shown in step S104 of FIG. 4, at the first position, the control unit 50 detects a position of the graduation on the linear scale 33 by the camera-side encoder head 32. As shown in (a) of FIG. 5, at the first position, since the center line 32a of the camera-side encoder head 32 is located at a position of the N-th graduation on the linear scale 33, data indicating that the center line 32a of the camera-side encoder head 32 is at the position of the N-th graduation on the linear scale 33 is input to the control unit 50 from the camera-side encoder head 32 (a position detecting step).

Next, as shown in step S105 of FIG. 4, the control unit 50 acquires an image of the bonding region including the alignment mark 17 using the camera 25. In (c) of FIG. 5, reference numerals 26x and 26y indicate center lines of the field of view 27 orthogonal to the optical axis 26z, and an intersection of the X directional center line 26x and the Y directional center line 26y is the position C(x, y) of the optical axis 26z of the camera 25. In addition, a center of a line connecting the two alignment marks 17 is the center position S(x, y) of the bonding region. The control unit 50 processes the image shown in (c) of FIG. 5 to detect a position difference ΔC(x, y), which is a first position difference, between the position C(x, y) of the optical axis 26z and the center position S(x, y) of the bonding region (a position identifying step). The position difference ΔC is a first relative position of the camera 25 in relation to the bonding region which is the specific region.

Next, as shown in step S106 of FIG. 4, the control unit 50 moves the base 10 in the X direction using the linear motor 12 shown in FIG. 1. At this time, the control unit 50 detects data of a graduation on the linear scale 33 using the bonding head-side encoder head 31. Then, the control unit 50 moves the base 10 in the X direction until the graduation on the linear scale 33 detected by the bonding head-side encoder head 31 reaches the position of the N-th graduation. As shown in (a) of FIG. 6, when the graduation on the linear scale 33 detected by the bonding head-side encoder head 31 reaches the position of the N-th graduation, the graduation on the linear scale 33 for the center position BH(x, y) of the bonding tool 21, which is the same position as the center line 22z of the bonding head 20, moves to the position of the N-th graduation, that is, the position C(x, y) at which the optical axis 26z of the camera 25 was previously located.

Figure 6:
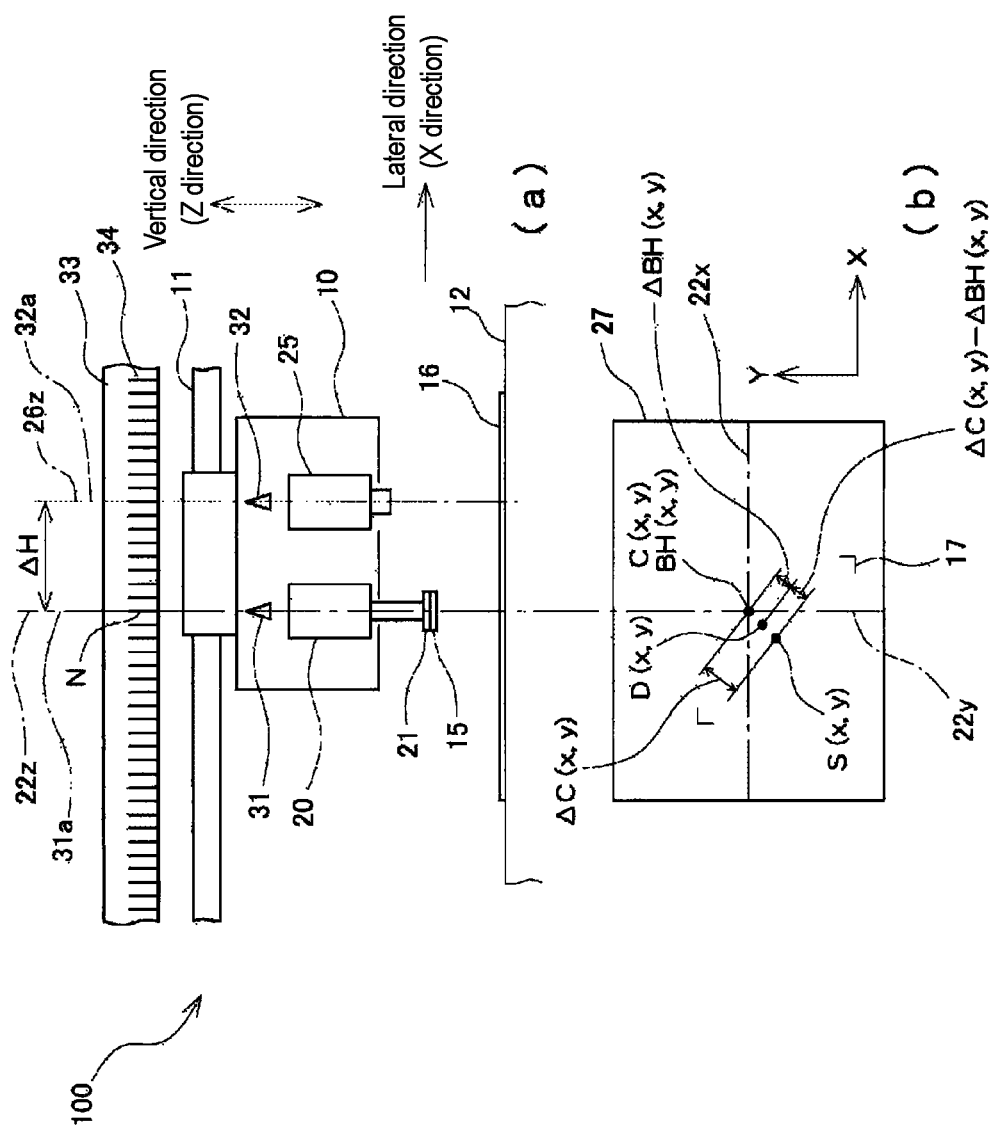
FIG. 6 shows an operation of the mounting device shown in FIG. 4, in which (a) of FIG. 6 is an elevational view showing a state in which the base is moved such that the center line of the bonding head-side encoder head is aligned with a position of a graduation on the linear scale detected by the camera-side encoder head and (b) of FIG. 6 is an explanatory diagram showing a positional relationship between the bonding tool and an alignment mark of a substrate at that time.

(b) of FIG. 6 is a diagram showing the center position BH(x, y) of the bonding tool 21, the center position S(x, y) of the bonding region, and the center position D(x, y) of the semiconductor die 15 viewed from above in the state mentioned above. Also, since (b) of FIG. 6 is a diagram viewed from above while (b) of FIG. 5 is a diagram viewed from below, the center position D(x, y) of the semiconductor die 15 in (b) of FIG. 6 is a position that is horizontally inverted from that of (b) of FIG. 5.

As shown in (b) of FIG. 6, the center position BH(x, y) of the bonding tool 21 is located at the position C(x, y) where the optical axis 26z of the camera 25 was previously located, and the center position D(x, y) of the semiconductor die 15 is separated leftward and downward from the center position BH(x, y) of the bonding tool 21 by the position difference ΔBH(x, y). Also, the center position S(x, y) of the bonding region is separated leftward and downward from the center position BH(x, y) of the bonding tool 21 by the position difference ΔC(x, y). Further, the center position D(x, y) of the semiconductor die 15 is located at a position separated rightward and upward from the center position S(x, y) of the bonding region by a position difference (ΔC(x, y)-ΔBH(x, y)).

Therefore, if the position of the center line 22z of the bonding head 20 is moved leftward in the X direction by (ΔC(x)-ΔBH(x)) and downward in the Y direction by (ΔC(y)-ΔBH(y)), the center position D(x, y) of the semiconductor die 15 will coincide with the center position S(x, y) of the bonding region.

Therefore, as shown in step S107 of FIG. 4, the control unit 50 causes the linear motor 12 to move the position of the base 10 leftward in the X direction by (ΔC(x)-ΔBH(x)), and causes the Y direction drive mechanism (not shown) to move the position of the base 10 downward in the Y direction by (ΔC(y)-ΔBH(y)). In this way, the control unit 50 moves the base 10 by the distance corresponding to the position difference ΔC(x, y) between the center position S(x, y) of the bonding region and the position C(x, y) of the optical axis 26z, and the position difference ΔBH(x, y) between the center position BH(x, y) of the bonding tool 21 and the center position D(x, y) of the semiconductor die 15 (a positioning step).

Then, the control unit 50 proceeds to step S108 in FIG. 4, and causes the bonding head 20 to lower the bonding tool 21, thereby bonding the semiconductor die 15 onto the substrate 16.

As described above, the mounting device 100 of the present embodiment can perform bonding by adjusting the center position D of the semiconductor die 15 to the center position S of the bonding region without calibrating the predetermined interval ΔH that is the offset distance.

Next, another operation of the mounting device 100 will be described with reference to FIG. 7. The same steps as those described above with reference to FIG. 4 are denoted by the same reference numerals, and descriptions thereof will be omitted.

Figure 7:
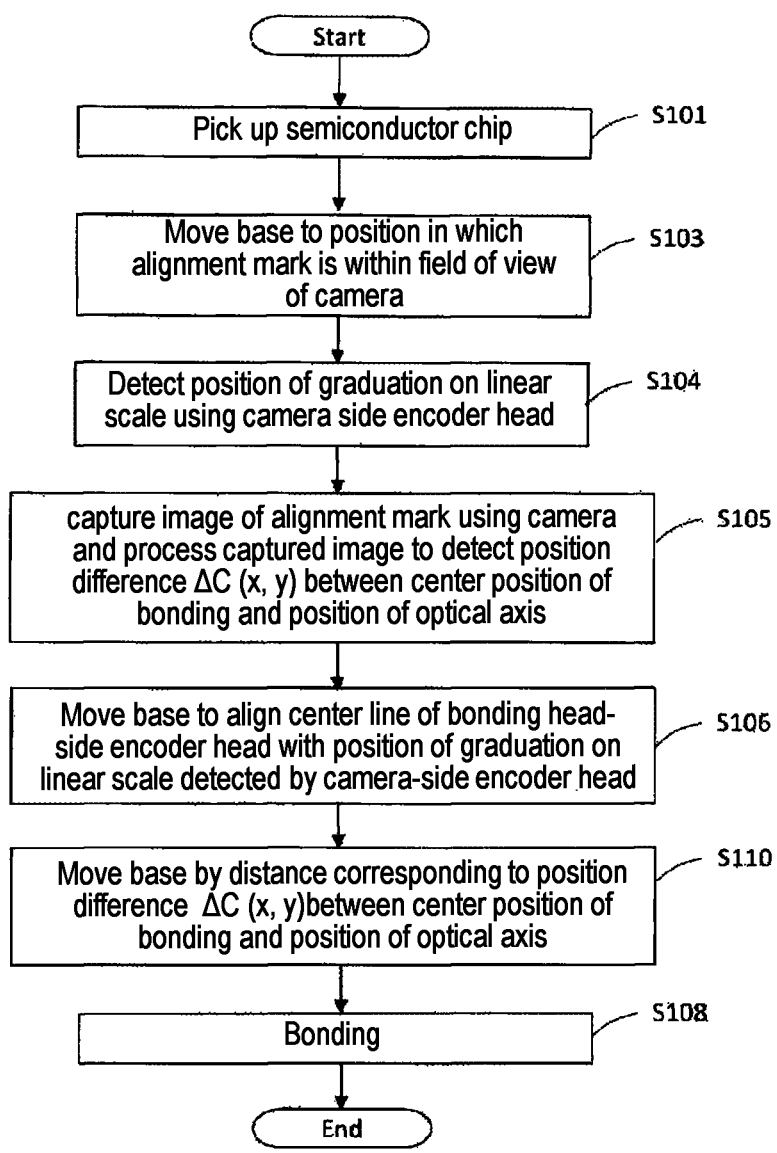
FIG. 7 is a flowchart showing another operation of the mounting device shown in FIG. 1.

The operation shown in FIG. 7 shows an operation in the case in which the lower camera 40 does not detect the position difference ΔBH(x, y) between the center position BH(x, y) of the bonding tool 21 and the center position D(x, y) of the semiconductor die 15. In this case, as shown in FIG. 7, after the base 10 is moved in step S106 of FIG. 7, the control unit 50 moves the base 10 by a distance corresponding to the position difference ΔC(x, y) between the center position S(x, y) of the bonding region and the position C(x, y) of the optical axis 26z, as shown in step S110 in FIG. 7. That is, the control unit 50 causes the linear motor to move the position of the base 10 12 leftward in the X direction by (ΔC(x)), and causes the Y direction driving mechanism (not shown) to move the position of the base 10 downward in the Y direction by (ΔC(y)).

Similarly to the operation described above with reference to FIG. 4, this operation also enables the bonding to be performed by adjusting the center position D of the semiconductor die 15 the center position S of the bonding region without calibrating the predetermined interval ΔH that is the offset distance.

Next, another operation of the mounting device 100 will be described with reference to FIG. 8. First, an operation similar to the operation described with reference to FIG. 4 will be briefly described.

Figure 8:
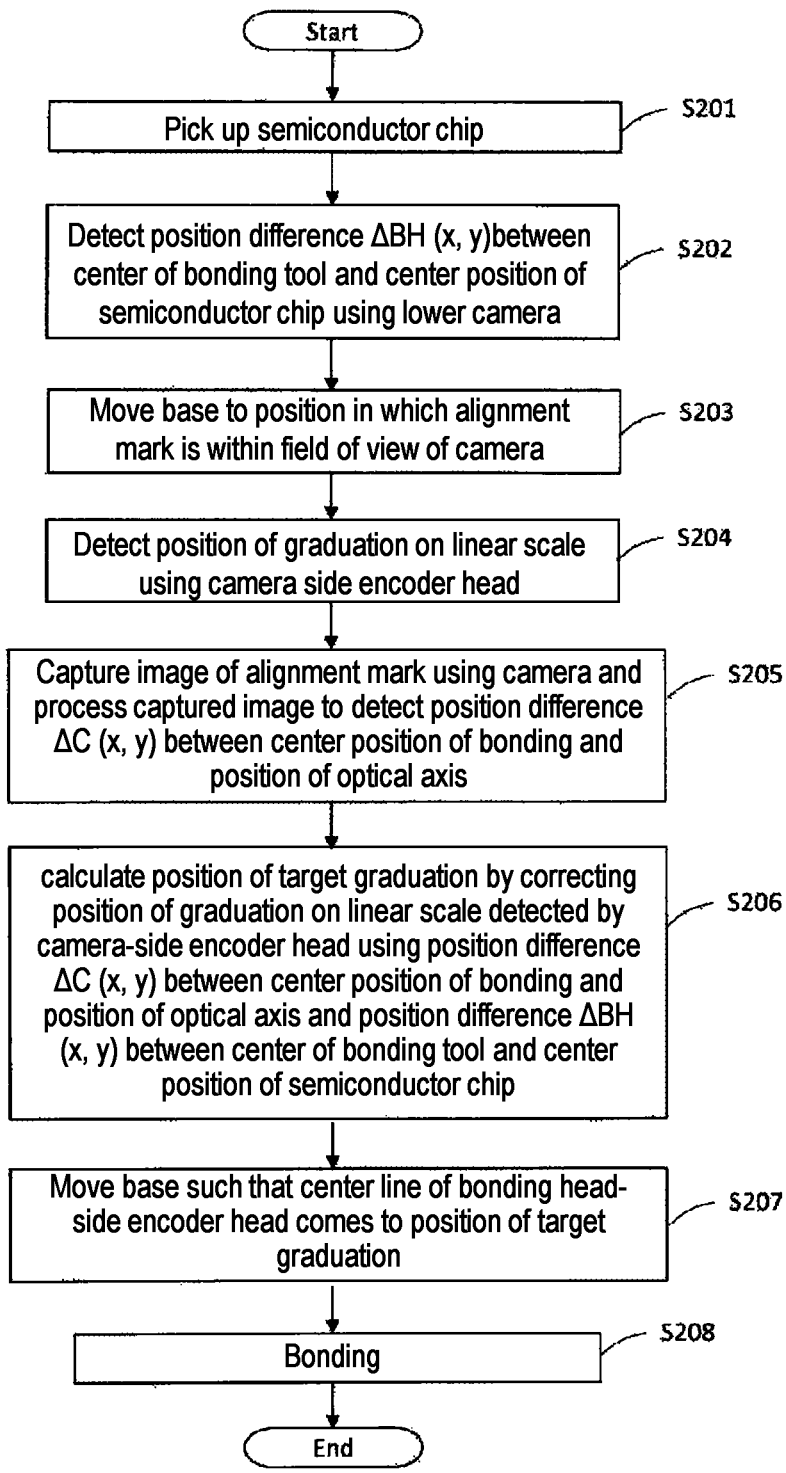
FIG. 8 is a flowchart showing another operation of the mounting device shown in FIG. 1.

Steps S201 to S205 shown in FIG. 8 are the same as steps S101 to S105 in FIG. 4. This operation is configured such that, in step S206 in FIG. 8, a position of a target graduation N2 is calculated by correcting a position of graduation on the linear scale 33 using the position difference ΔC(x, y) between the center position S(x, y) of the bonding region and the position C(x, y) of the optical axis 26z, and the position difference ΔBH(x, y) between the center position BH(x, y) of the bonding tool 21 and the center position D(x, y) of the semiconductor die 15, and then, as shown in step S207 in FIG. 8, the base 10 is moved such that the center line 31a of the bonding head-side encoder head 31 comes to the position of the target graduation N2.

Figure 9:
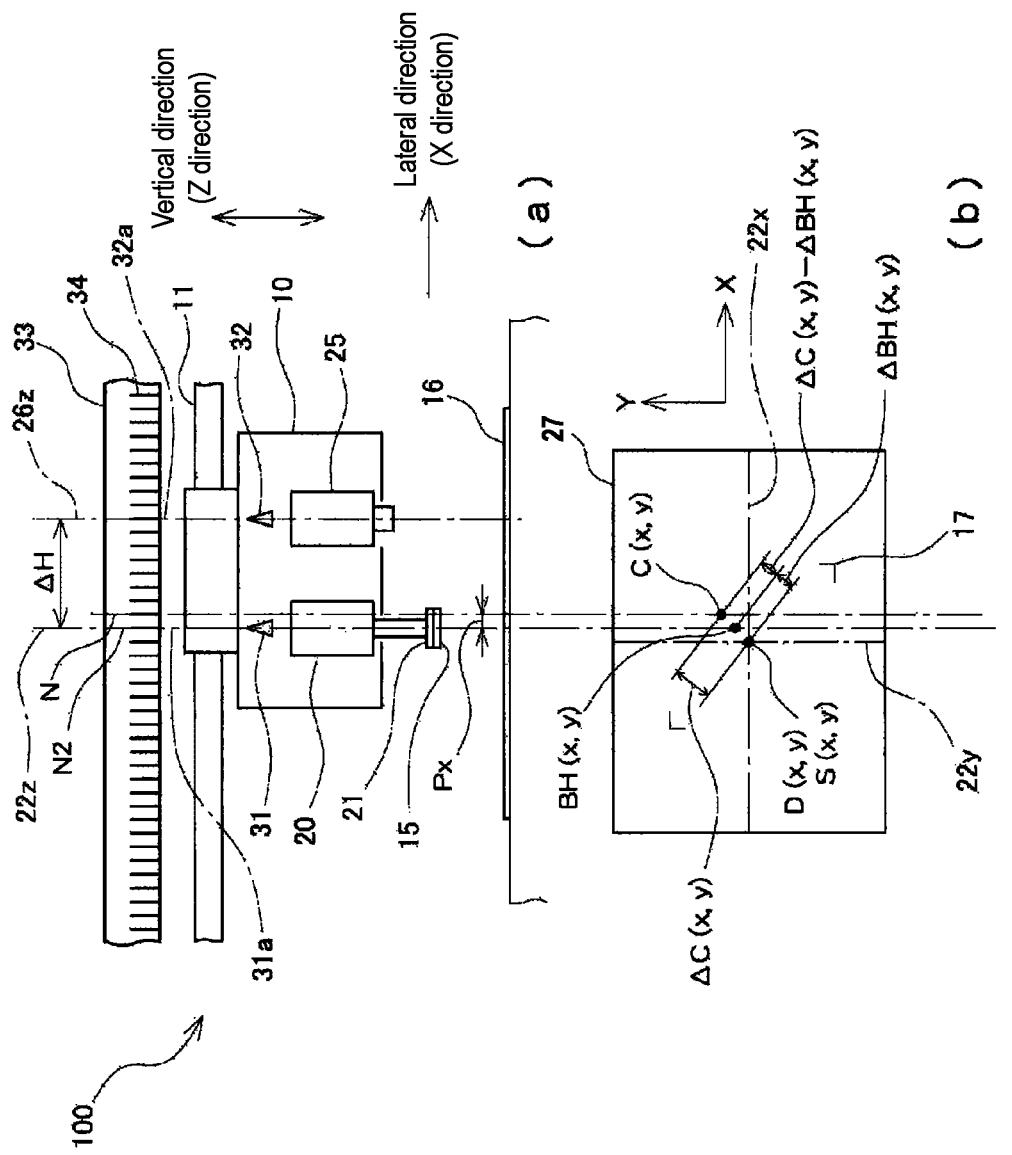
FIG. 9 shows an operation of the mounting device shown in FIG. 8, in which (a) of FIG. 9 is an elevational view showing a state in which the base is moved such that the center line of the bonding head-side encoder head is aligned with a position of a target graduation and (b) of FIG. 9 is an explanatory diagram showing a positional relationship between the bonding tool and the alignment mark of the substrate at that time.

FIG. 9 shows a state where the center position D(x, y) of the semiconductor die 15 coincides with the center position S(x, y) of the bonding region. As described above with reference to (b) of FIG. 6, when the center position BH(x, y) of the bonding tool 21 is located at the position C(x, y) where the optical axis 26z of the camera 25 was previously located, the center position D(x, y) of the semiconductor die 15 is a position separated rightward and upward from the center position S(x, y) of the bonding region by the position difference (ΔC(x, y)-ΔBH(x, y)). Therefore, if the center position BH(x, y) of the bonding tool 21 is shifted leftward and downward from the position C(x, y) where the optical axis 26z of the camera 25 was previously located by position difference (ΔC(x, y)-ΔBH(x, y)), the center position D(x, y) of the semiconductor die 15 will coincide with the center position S(x, y) of the bonding region.

Therefore, the control unit 50 calculates the position of the target graduation N2 obtained by correcting the position of the graduation N on the linear scale 33 for the position C(x, y) at which the optical axis 26z of the camera 25 was previously located by an amount of graduation corresponding to (ΔC(x)-ΔBH(x)). Then, as shown in FIG. 9, the base 10 is moved to a position where the position of the center line 31a of the bonding head-side encoder head 31 reaches the position of the target graduation N2, that is, the position where the position of the graduation on the linear scale 33 detected by the bonding head-side encoder head 31 reaches the position of the target graduation N2 (a positioning step). Thus, the center position D(x) of the semiconductor die 15 can coincide with the center position S(x) of the bonding region. Here, the difference in graduation between the position of the graduation N on the linear scale 33 for the position C(x, y) where the optical axis 26z of the camera 25 was previously located and the position of the target graduation N2 is a correction amount Px of the position of the base 10.

Further, at the same time, the control unit 50 moves the base 10 downward in the Y direction by (ΔC(y)-ΔBH(y)). Thus, the center position D(x, y) of the semiconductor die 15 can coincide with the center position S(x, y) of the bonding region.

According to the operation referring to FIG. 8, since one operation in the X direction can cause the center position D(x) of the semiconductor die 15 to coincide with the center position S(x) of the bonding region, positioning can be performed at a higher speed than that of the operation described with reference to FIG. 4. Further, with this operation, the bonding can also be performed by adjusting the center position D of the semiconductor die 15 to the center position S of the bonding region without calibrating the predetermined interval ΔH that is the offset distance.

Figure 10:
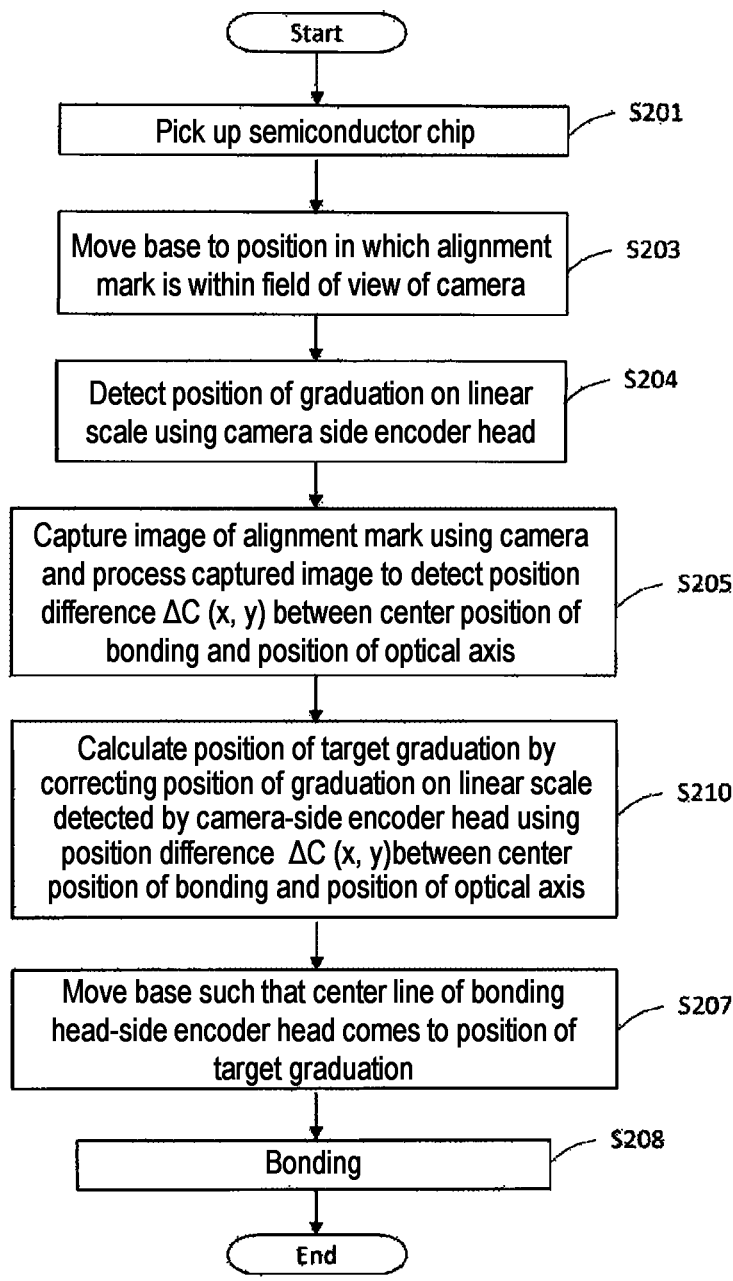
FIG. 10 is a flowchart showing another operation of the mounting device shown in FIG. 1.

FIG. 10 shows the operation of FIG. 8, in which, similar to the operation shown in FIG. 7, the lower camera 40 does not detect the position difference ΔBH(x, y) between the center position BH(x, y) of the bonding tool 21 and the center position D(x, y) of the semiconductor die 15.

As described above, since the mounting device 100 of the present embodiment can perform bonding by adjusting the center position D of the semiconductor die 15 to the center position S of the bonding region without performing calibration of the predetermined interval ΔH that is the offset distance, it is possible to improve the bonding accuracy without calibrating the predetermined interval ΔH that is the offset distance. Further, since there is no need to calibrate the offset distance, productivity of bonding can be improved.

Although the embodiment of the present invention has been described using the mounting device 100 as an example, the present invention is not limited to a flip chip bonding apparatus or a die bonding apparatus, and can be applied to various devices. For example, the present invention can be applied to a wire bonding apparatus, an industrial robot, and a transfer device. The present invention is not limited to the object to be transported or mounted, the size of the object, and the technical field of the object, and can be applied to any device.

The invention claimed is:

1. A device for positioning a first object in relation to a second object, comprising:
   a moving body which moves linearly in relation to the second object;
   a holding unit attached to the moving body to hold the first object;
   a position identifying means which is attached to the moving body with a predetermined interval from the holding unit in a moving direction of the moving body and identifies a position of the second object;
   a scale which is disposed in the moving direction of the moving body and includes a plurality of graduations in the moving direction;
   a first position detection unit which is attached to the moving body to correspond to the holding unit and detects a position of the holding unit on the basis of the graduations;
   a second position detection unit which is attached to the moving body with a predetermined interval from the first position detection unit to correspond to the position identifying means and detects a position of the graduation on the scale that corresponds to the identified position of the second object; and
   a control unit which moves the moving body to a position at which the first position detection unit detects the position of the graduation to position the first object in relation to the second object.

2. The device according to claim 1,
   wherein the first object is a semiconductor die,
   the second object is a substrate or other semiconductor die on which the semiconductor die is mounted, and
   the device positions the first object at a predetermined region of the second object.

3. The device according to claim 1,
   wherein the position identifying means is a camera that optically identifies the position of the second object, and
   the control unit is configured to:
   move the moving body to a first position at which a specific region of the second object is within a field of view of the position identifying means to detect the position of the graduation on the scale at the first position using the second position detection unit,
   detect a first relative position of the position identifying means in relation to the specific region on the basis of an image of the specific region of the second object captured by the position identifying means, and
   calculate a correction amount for correcting a position of the moving body when positioning the first object in relation to the second object, on the basis of the first relative position.

4. The device according to claim 2,
   wherein the position identifying means is a camera that optically identifies the position of the second object, and
   the control unit is configured to:
   move the moving body to a first position at which a specific region of the second object is within a field of view of the position identifying means to detect the position of the graduation on the scale at the first position using the second position detection unit,
   detect a first relative position of the position identifying means in relation to the specific region on the basis of an image of the specific region of the second object captured by the position identifying means, and
   calculate a correction amount for correcting a position of the moving body when positioning the first object in relation to the second object, on the basis of the first relative position.

5. The device according to claim 1, further comprising a holding position identifying means which is disposed on a holding surface side of the holding unit and identifies a second relative position of the first object in relation to the holding surface,
   wherein the control unit calculates a correction amount for correcting a position of the moving body when positioning the first object in relation to the second object, on the basis of the second relative position.

6. The device according to claim 3, wherein the control unit calculates a position of a target graduation on the scale on the basis of the correction amount.

7. The device according to claim 4, wherein the control unit calculates a position of a target graduation on the scale on the basis of the correction amount.

8. The device according to claim 5, wherein the control unit calculates a position of a target graduation on the scale on the basis of the correction amount.

9. A method for positioning a first object in relation to a second object, comprising steps of:
   holding the first object using a holding unit;
   moving a moving body provided with the holding unit for holding the first object and a position identifying means to a predetermined position;
   identifying a position of the second object using the position identifying means attached to the moving body with a predetermined interval from the holding unit in a moving direction of the moving body;
   detecting a position of a graduation on a scale that corresponds to the identified position of the second object using a second position detection unit attached to the moving body with a predetermined interval from a first position detection unit to correspond to the position identifying means; and
   positioning the first object in relation to the second object by reading a graduation on the scale using the first position detection unit disposed on the moving body and moving the holding unit to a position for detecting the position of the graduation.

* * * * *